US008368122B2

(12) United States Patent
Domine et al.

(10) Patent No.: US 8,368,122 B2
(45) Date of Patent: Feb. 5, 2013

(54) MULTIPLE-JUNCTION PHOTOELECTRIC DEVICE

(75) Inventors: Didier Domine, Bienne (CH); Peter Cuony, Neuchatel (CH); Julien Bailat, Glovelier (CH)

(73) Assignee: Universite de Neuchatel, Neuchatel (CH)

( * ) Notice: Subject to any disclaimer, the term of this patent is extended or adjusted under 35 U.S.C. 154(b) by 0 days.

(21) Appl. No.: 13/130,205

(22) PCT Filed: Nov. 18, 2009

(86) PCT No.: PCT/EP2009/065369
§ 371 (c)(1),
(2), (4) Date: Jul. 14, 2011

(87) PCT Pub. No.: WO2010/057907
PCT Pub. Date: May 27, 2010

(65) Prior Publication Data
US 2011/0260164 A1     Oct. 27, 2011

(30) Foreign Application Priority Data
Nov. 19, 2008  (EP) ..................... 08169424

(51) Int. Cl.
*H01L 27/148*   (2006.01)
*H01L 29/768*   (2006.01)
*H01L 31/062*   (2006.01)
*H01L 31/113*   (2006.01)
*H01L 31/06*    (2012.01)

(52) U.S. Cl. ........ 257/233; 257/292; 257/293; 257/462; 257/E31.052; 257/E31.053; 257/E31.069; 257/E31.073; 257/E31.079; 257/E31.082; 257/E31.096; 257/E31.115; 257/E31.121; 257/E33.076; 257/E33.077

(58) Field of Classification Search .................. 257/233, 257/292, 293, 462, E31.052, E31.053, E31.069, 257/E31.073, E31.079, E31.082, E31.096, 257/E31.115, E31.121, E33.076, E33.077
See application file for complete search history.

(56) References Cited

U.S. PATENT DOCUMENTS
4,915,744 A * 4/1990 Ho et al. ..................... 136/262
6,522,379 B1 * 2/2003 Ishihara et al. ............... 349/139
(Continued)

FOREIGN PATENT DOCUMENTS
WO   2007113037 A1   10/2007

OTHER PUBLICATIONS

Sannomiya Hed: "a-SiC/a-Si/a-SiGe Multi-Bandgap Stacked Solar Cells With Bandgap Profiling", Japan Society of Applied Physics: Proceedings of the International Photovoltaic Science and Engineering Conference, vol. Conf. 5, Nov. 26, 1990, pp. 387-390, XP000215068.

(Continued)

*Primary Examiner* — Ida M Soward
(74) *Attorney, Agent, or Firm* — Young & Thompson

(57) ABSTRACT

A multiple-junction photoelectric device includes a substrate with a first conducting layer thereon, at least two elementary photoelectric devices of p-i-n or p-n configuration, with a second conducting layer thereon, and at least one intermediate layer between two adjacent elementary photoelectric devices. The intermediate layer has, on the incoming light side, opposite top and bottom faces, the top and bottom faces having respectively a surface morphology including inclined elementary surfaces so $\alpha_{90bottom}$ is smaller than $\alpha_{90top}$ by at least 3°, preferably 6°, more preferably 10°, and even more preferably 15°; where $\alpha_{90top}$ is the angle for which 90% of the elementary surfaces of the top face of the intermediate layer have an inclination equal to or less than this angle, and $\alpha_{90bottom}$ is the angle for which 90% of the elementary surfaces of the bottom face of the intermediate layer have an inclination equal to or less than this angle.

14 Claims, 2 Drawing Sheets

U.S. PATENT DOCUMENTS

| | | | |
|---|---|---|---|
| 6,576,112 B2 * | 6/2003 | Sonoda et al. | 205/155 |
| 6,825,408 B2 | 11/2004 | Nagano et al. | |
| 7,915,522 B2 * | 3/2011 | Petti | 136/256 |
| 7,955,889 B1 * | 6/2011 | Yang et al. | 438/82 |
| 8,237,175 B2 * | 8/2012 | Moustakas et al. | 257/79 |
| 2001/0012569 A1 * | 8/2001 | Arao et al. | 428/632 |
| 2002/0011263 A1 | 1/2002 | Muramoto et al. | |
| 2002/0050289 A1 | 5/2002 | Wada et al. | |
| 2002/0134425 A1 | 9/2002 | Yamamoto et al. | |
| 2005/0189012 A1 * | 9/2005 | Kondo et al. | 136/256 |
| 2007/0125415 A1 * | 6/2007 | Sachs | 136/205 |
| 2007/0151596 A1 * | 7/2007 | Nasuno et al. | 136/256 |
| 2008/0213612 A1 * | 9/2008 | Starikov et al. | 428/573 |
| 2009/0320910 A1 * | 12/2009 | Matsui et al. | 136/252 |
| 2010/0116332 A1 * | 5/2010 | Counil et al. | 136/256 |

OTHER PUBLICATIONS

Benedict J. et al: Recent Developments in the use of the tripod polisher for tem specimen preparation, Met. Res. Soc. Symp. Proc. 1992, vol. 254, pp. 121-140.

Buehlmann P et al: "In situ silicon oxide based intermediate reflector for thin-film silicon micromorph solar cells", Applied Physics Letters, 2007, 91, 143505.

Cicala G. et al: "Plasma deposition of amorphous silicon alloys from fluorinated gases", Pure & Appl. Chem., 1996, vol. 68, No. 5, pp. 1143-1149.

Dalakos G et al: "Surface Roughness Study of Low-temperature PECVD a-Si:H.", Mat. Res. Soc. Symp. Proc. 2003, vol. 762, pp. A5.14.1-A5.14.6.

Fay S et al: "Opto-electronic properties of rough LP-CVD ZnO:B for use as TCO in thin-film silicon solar cells", Thin Solid Films, 2007, 515, pp. 8558-8561.

Fischer D et al: "The "Micromorph" Solar Cell: Extending A-Si:H Technology Towards Thin Film Crystalline Silicon", 25th PVSC, May 13-17, 1996; Washington, D.C, pp. 1053-1056.

Meier J et al: "Progress in Up-Scaling of Thin Film Silicon Solar Cells by Large-Area PECVD KAI Systems", 2005, pp. 1464-1467.

Thornton J: "The microstructure of sputter-deposited coatings", J. Vac. Sci. Technol. A, Nov./Dec. 1986, vol. 4 (6), pp. 3059-3065.

* cited by examiner

MULTIPLE-JUNCTION PHOTOELECTRIC DEVICE

TECHNICAL FIELD

The present invention relates to the field of photoelectric devices. More particularly, it relates to a photoelectric device composed of elementary cells of p-i-n or p-n configuration, which are stacked on top of one another and absorb the light over different wavelength ranges. Such devices are called multiple-junction cells. The invention also relates to a process for producing this photoelectric device.

A particularly advantageous application of the present invention is for the production of photovoltaic cells intended for generating electrical energy, but the invention also applies, more generally, to any structure in which light radiation is converted into an electrical signal, such as photodetectors.

PRIOR ART

Conventionally, a silicon thin-film double-junction or tandem cell consists of a top cell made of amorphous silicon, which absorbs visible light (up to about 750 nm), and a bottom cell made of microcrystalline silicon, which absorbs light up to the infrared (up to about 1100 nm). Such a cell is called a "micromorph" cell. In the present description, "top" denotes the side close to the incident light while "bottom" denotes the side away from the incident light.

To increase the current, both in a simple cell and in a multiple-junction cell, the front transparent contact is rough so as to scatter the light in the device. The layers are deposited on top of another and then the substrate roughness propagates through the interfaces of the layers. Usually, thin layers (0-500 nm) keep the original surface roughness of the substrate.

A rough surface consists of a succession of bumps and hollows formed from elementary surfaces of greater or lesser inclination. The morphology of the surface of the substrate plays a paramount role in the optical performance (short-circuit current density ($J_{sc}$)) and electrical performance (open-circuit voltage ($V_{oc}$) and fill factor (FF)), i.e. the efficiency of the cell.

As regards microcrystalline cells, such a cell has better electrical characteristics (better fill factor (FF) and better open-circuit voltage (Voc)) if it is deposited on a substrate having no or few highly inclined elementary surfaces. However, highly inclined elementary surfaces at the interfaces with a change of refractive index promote the scattering of the light in the cell. Thus, the optical characteristics of the cell (short-circuit current density ($J_{sc}$)) are improved. Consequently, the optimum morphology is a compromise between the electrical characteristics and the optical characteristics of the solar cell.

As regards an amorphous cell, the electrical characteristics of the amorphous cell suffer much less from a substrate morphology having highly inclined elementary surfaces. However, it suffers from degradation in efficiency when it is exposed to light. The means of limiting the degradation is to reduce the thickness of the cell. To reduce the thickness of the cell and maintain good efficiencies, substrates with highly inclined elementary surfaces are used to increase the light scattering in the cell.

In a tandem or multi-junction cell, the problem consists in increasing the current in the cells using rough surfaces that scatter the light in the cell while maintaining good electrical characteristics of the cell. However, the optimum morphologies for the top and bottom cells are different. Specifically, the top cell requires a substrate morphology having highly inclined elementary surfaces so as to increase its current, to reduce its thickness and thus limit its degradation. However, with this type of morphology, the bottom microcrystalline cell suffers from an unsuitable morphology, which is manifested in the tandem cell by the same symptoms as in a single cell, namely a drop in the fill factor FF and in the open-circuit voltage $V_{oc}$.

To alleviate this problem, it has been proposed to place an intermediate mirror (50-150 nm in thickness) between the top cell and the bottom cell, enabling the top cell current to be increased. An intermediate mirror is a layer placed between two elementary cells with a refractive index smaller than the refractive indices of the elementary cells. For a "micromorph" cell, such an intermediate mirror with a refractive index of typically between 1.3 and 2.5 is inserted between the top cell and the bottom cell. This makes it possible to increase the current of the top cell without having to increase its thickness, thereby minimizing the effect of the degradation of the top cell under illumination.

However, the surface morphology of the top cell on which the intermediate mirror is deposited is very similar to the surface of the intermediate mirror deposited. In other words, the intermediate mirror deposited reproduces the surface morphology of the top cell and does not make it possible to change the morphology in order to produce a morphology suitable for the growth of the bottom cell.

U.S. Pat. No. 6,825,408 describes the use, between the top cell and the bottom cell, of an intermediate layer having irregular surfaces of different heights (Ry or Rmax), the light outgoing side having a greater average level difference and/or a greater maximum level difference when compared to the light receiving side. But U.S. Pat. No. 6,825,408 describes only the use of the n-i-p structure, whereas the present invention is limited to the use of p-i-n.

Patent application US 2002/0011263 describes the use, between the top cell and the bottom cell, of an intermediate layer having irregular surfaces of different heights. However, patent application US 2002/0011263 describes only ways to produce uneven surfaces to increase the light-trapping properties of the device, whereas the problem of the present invention is to produce a morphology suitable for the growth of the bottom cell. Moreover, US 2002/0011263 discloses substantially the use of the n-i-p structure, whereas the present invention is limited to the use of p-i-n. Even if US 2002/011263 discloses, in its Example 5, a solar cell comprising two p-i-n photoelectric devices and an intermediate layer provided between said photoelectric devices, FIG. 5 shows that the bottom face (light outgoing side) of the intermediate layer comprises inclined elementary surfaces and that the top face (light receiving side) of the intermediate layer is substantially flat.

This morphology doesn't correspond to the optimum surface morphologies for the two cells, and is not suitable for the growth of the bottom cell. Furthermore, in US 2002/0011263, the surface level difference (Ry) of the photoelectric conversion device lying below the intermediate layer (i.e. the first electrode layer) is in the range of 5 to 150 nm. Therefore, the bottom face of the intermediate layer has also a surface level difference (Ry) comprised between 5 nm and 150 nm. FIG. 7 of US 2002/0011263 shows that the surface level difference of the first electrode should be less than 150 nm. Indeed, it is disclosed in this document that the electrical properties of the crystalline silicon photoelectric conversion device decrease rapidly if Ry is greater than 150 nm.

An object of the present invention is therefore to alleviate these drawbacks, by providing a higher-performance photoelectric device having separately optimized surface morphologies for the growth of each of the two elementary cells.

DISCLOSURE OF THE INVENTION

For this purpose, and in accordance with the present invention, what is proposed is a multiple-junction photoelectric device comprising a substrate on which a first conducting layer is deposited, at least two elementary photoelectric devices of p-i-n or p-n configuration, on which a second conducting layer is deposited, and at least one intermediate layer provided between two adjacent elementary photoelectric devices, said intermediate layer having, on the incoming light side, a top face and, on the other side, a bottom face, said top and bottom faces having respectively a surface morphology comprising inclined elementary surfaces such that $\alpha_{90bottom}$ is smaller than $\alpha_{90top}$ by at least 3°, preferably 6°, more preferably 10°, and even more preferably 15°; where $\alpha_{90top}$ is the angle for which 90% of the elementary surfaces of the top face of the intermediate layer have an inclination equal to or less than this angle, and $\alpha_{90bottom}$ is the angle for which 90% of the elementary surfaces of the bottom face of the intermediate layer have an inclination equal to or less than this angle.

Such surface morphologies make it possible for the morphologies required by each of the faces of the intermediate layer to be optimally reconciled and thus make it possible for a higher-performance device to be obtained.

In the present invention, contrary to the teaching of U.S. Pat. No. 6,825,408, the light outgoing side of the intermediate layer is flattened to better adapt the morphology to the growth of the bottom cell, the morphology of the surfaces being drastically modified without necessarily modifying the average height difference. The documents of the prior art teach to modify the height difference or the peak to valley roughness, but they give no indication about the angular morphology of the elementary surfaces of the faces of the intermediate layer. From a geometric point of view, the peak to valley roughness could be modified while keeping the same angles of the elementary surfaces.

The aim of the present invention is to produce more even surface to better adapt the morphology to the growth of the bottom cell, said bottom cell having a p-i-n or p-n configuration.

The present invention also relates to a process for producing a multiple-junction photoelectric device comprising a substrate on which a first conducting layer is deposited, at least two elementary photoelectric devices of p-i-n or p-n configuration on which a second conducting layer is deposited. According to the invention, the process includes a step of depositing, on at least one of said elementary photoelectric devices, an intermediate layer having, on the incoming light side, a top face and, on the other side, a bottom face, said top and bottom faces having respectively a surface morphology comprising inclined elementary surfaces such that $\alpha_{90bottom}$ is smaller than $\alpha_{90top}$ by at least 3°, preferably 6°, more preferably 10°, and even more preferably 15°; where $\alpha_{90top}$ and $\alpha_{90bottom}$ are defined above.

BRIEF DESCRIPTION OF THE DRAWINGS

Other features of the present invention will become more clearly apparent on reading the following description, given with reference to the appended drawings in which.

EMBODIMENTS OF THE INVENTION

Figure 1:
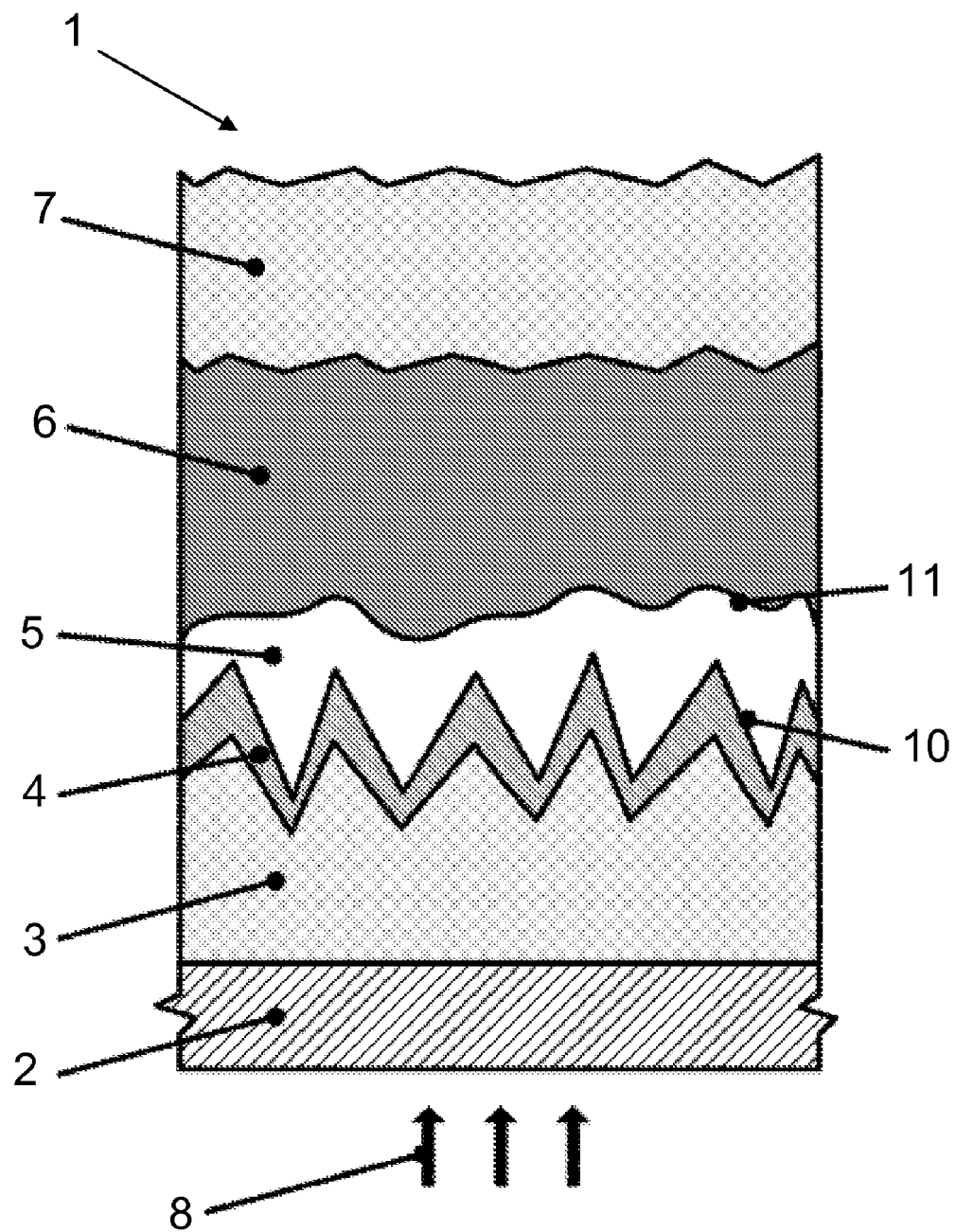
FIG. 1 shows a diagram of a tandem cell according to the invention.

FIG. 1 shows a photoelectric device or a "micromorph" cell 1 comprising, stacked on top of one another, a substrate 2, a first transparent conducting layer 3, constituting a first electrode, a first elementary photoelectric device 4, called the top cell, an intermediate layer 5, a second elementary photoelectric device 6, called the bottom cell, and a second conducting layer 7, constituting a second electrode. The device 1 is exposed to light oriented along the arrows 8.

The intermediate layer 5 has, on the incoming light side, a top face 10 and, on the other side, a bottom face 11.

According to the invention, said top 10 and bottom 11 faces have respectively a surface morphology comprising inclined elementary surfaces such that $\alpha_{90bottom}$ is smaller than $\alpha_{90top}$ by at least 3°, preferably 6°, more preferably 10°, and even more preferably 15°; where $\alpha_{90top}$ is the angle for which 90% of the elementary surfaces of the top face of the intermediate layer have an inclination equal to or less than this angle, and $\alpha_{90bottom}$ is the angle for which 90% of the elementary surfaces of the bottom face of the intermediate layer have an inclination equal to or less than this angle.

For example, the difference ($\alpha_{90top} - \alpha_{90bottom}$) may be comprised between 3° and 60°, preferably between 6° and 25° and more preferably between 7° and 15°.

Figure 2:
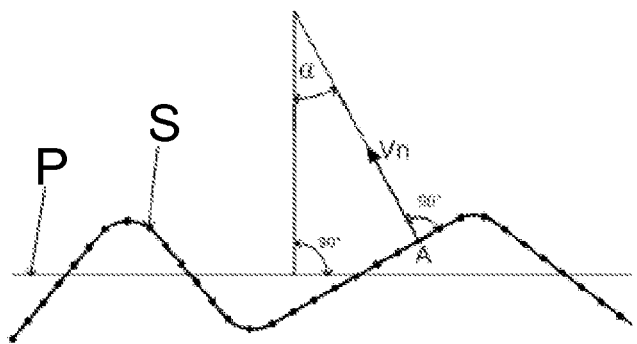
FIG. 2 shows a diagram illustrating the calculation of the angle of inclination of the surface at the point A of an image obtained by atomic force microscopy (AFM)

Referring to FIG. 2, the morphology of the surface is described here by the inclinations of the elementary surfaces making up the rough surface of the specimen, also called the angular distribution of the surface. To do this, an AFM measurement is carried out on a surface measuring 5 μm×5 μm corresponding to a matrix of 256×256 equidistant points (x and y axes in the conventional coordinate system) which represents the topology (z axis) of the surface of the specimen. To remove any inclination or curvature of the substrate, the 2nd-order polynomial that minimizes the sum of the squared differences between itself and the surface is subtracted from this image. What is thus obtained is a good representation of the morphology of the surface S, which typically consists of structures having sizes between 50 and 2000 nm. The plane z=0 is defined as being the horizontal plane P.

To obtain the angular distribution of the surfaces, the angle between the vector normal to the horizontal plane P and the vector Vn normal to the surface S is calculated for each point A in the AFM image. To do this, the relevant elementary surface for calculating the normal to the point A is defined by the point A and two vectors Vx and Vy. Vx is the vector that connects the two points (close neighbours in the AFM matrix) before and after the point A in the direction x and Vy is the vector that connects the two points (close neighbours in the AFM matrix) before and after the point A in the direction y. The vector Vn normal to the elementary surface in question is determined by the vector product of Vx and Vy. The angle of inclination α of the elementary surface is defined as the angle between the normal vector Vn of the elementary surface in question and the vector normal to the horizontal plane P.

A new matrix of points representing the inclination of each elementary surface at each point in the AFM matrix may be constructed. Starting from the matrix that indicates the inclination at each point of the surface, it is possible to produce a histogram of the angles from 0 to 90° (angular distribution) that gives the proportion of the surface which has an inclination lying within a certain angle interval (typically 2 degrees). By integrating the latter, the integral of the angular distribution is obtained (cf. FIG. 3). The angles are plotted on the x-axis. The proportion of the elementary surfaces having an inclination equal to or less than a given angle is plotted on the y-axis. A flat horizontal surface is defined as having only elementary surfaces having an angle of inclination equal to 0°, and therefore the integral of the angular distribution is equal to 1 between 0° and 90°. In contrast, an extremely rough surface, with highly inclined elementary surfaces, shows an angular distribution with a high proportion of elementary surfaces having high angles of inclination and therefore the integral of the angular distribution is close to 0 for small angles (e.g.:)0°-15° and is close to 1 only for large angles (e.g.: 30°-70°).

In the present invention, to characterize the morphology of a surface, the value α in question is the angle $\alpha_{90}$ for which 90% of the elementary surfaces of the surface studied have an inclination equal to or less than this angle.

Preferably, the angle $\alpha_{90top}$ is comprised between 20° and 80°, and more preferably comprised between 40° and 80°.

Preferably, the angle $\alpha_{90bottom}$ is comprised between 0° and 40°, and more preferably comprised between 5° and 40°.

The peak to valley roughness is defined by JIS B0601 (maximum height; may be referred to as Ry or Rmax).

Preferably, the peak to valley roughness of the bottom face 11 is greater than 150 nm. For example, the peak to valley roughness of the bottom face 11 may be comprised between 200 nm and 2000 nm, preferably between 200 nm and 900 nm, and more preferably between 300 nm and 700 nm.

By controlling the morphology of the faces of the intermediate layer, the present invention allows to have an intermediate layer having a bottom face with a peak to valley roughness greater than 150 nm, in such a way as to promote the scattering of the light in the cell and to improve the optical characteristics of the cell, without any decrease of the electrical characteristics of the cell.

Preferably, the peak to valley roughness of the top face 10 is greater than the peak to valley roughness of the bottom face 11.

The peak to valley roughness of the top face 10 may be comprised between 200 nm and 2000 nm, preferably between 200 nm and 1000 nm.

The substrate 2 may be made of a material chosen from the group comprising glass and plastics (for example PEN, PET and polyimide).

The first conducting layer 3 is made of a transparent conducting oxide (for example ZnO, ITO or $SnO_2$) (cf. Fay, Steinhauser, Oliveira, Vallat-Sauvain and Ballif, "Opto-electronic properties of rough LP-CVD ZnO:B for use as TCO in thin-film silicon solar cells", Thin Solid Films, 515 (24), p. 8558-8561, 2007).

The second conducting layer 7 is made of a transparent conducting oxide (for example ZnO, ITO, InO, $SnO_2$, etc.), a metal (Ag, Al) or the combination of a transparent oxide and a metal (cf. Meier, Kroll, Spitznagel, Benagli, Roschek, Pfanner, Ellert, Androutsopoulos, Huegli, Buechel, Buechel, Nagel, Feitknecht and Bucher, <<Progress in up-scaling of thin film silicon solar cells by large-area PECVD KAI systems>>, Proc. of the 31th IEEE Photovoltaic Specialist Conference, Lake Buena Vista, Fla., USA, pp. 1464-1467, January, 2005).

The conducting layers 3 and 7 are deposited by processes known to those skilled in the art, such as evaporation, sputtering, and chemical deposition. For the first conducting layer 3, it is preferred to use the chemical deposition process (examples: LP-CVD ZnO, AP-CVD $SnO_2$) (cf. Fay, Steinhauser, Oliveira, Vallat-Sauvain and Ballif, "Opto-electronic properties of rough LP-CVD ZnO:B for use as TCO in thin-film silicon solar cells", Thin Solid Films, 515 (24), p. 8558-8561, 2007), making it possible to obtain a conducting layer having an optimum surface morphology for the top elementary cell 4.

The elementary photoelectric devices 4 and 6 may have the p-i-n or p-n configuration. This means that the first layer deposited for producing the elementary cell is the p layer, then optionally the i layer, and then the n layer. Of course, it is obvious that all combinations are possible. In particular when the device comprises two elementary cells, the four combinations p-i-n/p-i-n, p-n/p-i-n, p-n/p-n and p-i-n/p-n are possible. The p-i-n/p-i-n combination is preferred.

Advantageously, the elementary photoelectric device 4 or "top cell" located on the side facing the substrate 2 relative to the intermediate layer 5, is made of a semiconductor material characterized by a bandgap $E_{gtop}$ and the other elementary photoelectric device 6 or "bottom cell", located on the other side relative to the intermediate layer 5, is made of a semiconductor material characterized by a bandgap $E_{gbottom}$. Preferably, $E_{gtop}$ is greater than $E_{gbottom}$ so as to complementarily absorb the solar light spectrum.

The elementary photoelectric device 4, or top cell, is a semiconductor, preferably based on silicon, for a photovoltaic application. Preferably, it is based on amorphous silicon or on a silicon compound (for example SiC, SiO, SiGe, etc.). It has a thickness of between 20 and 800 nm, preferably between 100 nm and 250 nm.

The elementary photoelectric device 6, or bottom cell, is a semiconductor, preferably based on silicon, for a photovoltaic application. Preferably, it is based on crystalline silicon or microcrystalline silicon or silicon-germanium or a silicon compound enabling the energy bandgap to be reduced with respect to amorphous silicon.

Preferably, the elementary photoelectric device 4, or top cell, is based on amorphous silicon and the other elementary photoelectric device 6, or bottom cell, is based on microcrystalline silicon.

The elementary cells 4 and 6 are deposited by processes known to those skilled in the art. Preferably, a PECVD (plasma-enhanced chemical vapour deposition) process is used (cf. Fischer, Dubail, Selvan, Vaucher, Platz, Hof, Kroll, Meier, Torres, Keppner, Wyrsch, Goetz, Shah and Ufert, in 25 IEEE PVSC, Washington D.C., 1996, p. 1053).

After the top elementary cell 4 has been deposited, an intermediate layer 5 is deposited that establishes a suitable morphology for the growth of the bottom elementary cell 6.

The intermediate layer 5 consists of a layer of a material chosen from the group comprising zinc oxide, doped silicon oxides, doped porous silicon oxides, tin oxide, indium oxide, doped silicon carbide, doped amorphous silicon, doped microcrystalline silicon and combinations thereof. Preferably, doped silicon oxide is used, the refractive index of which is less than that of silicon and is between 1.3 and 2.5.

Preferably, the intermediate layer 5 has a thickness of between 10 nm and 500 nm, more preferably between 50 nm and 150 nm.

According to a variant of the invention, the surface morphology of the bottom face 11 of the intermediate layer 5, as defined above, may be obtained by the very nature of its fabrication process. To do this, during the step of depositing the intermediate layer 5, a one step process for depositing the intermediate layer 5 is used that makes it possible to obtain a planarized surface corresponding to the required surface morphology of the bottom face 11. This process uses one of the techniques chosen from the group comprising sputtering (cf. J. Thornton, Vac. Sci. Technol. A, Volume 4, Issue 6, pp. 3059-3065, 1986), dip coating, spin coating, or plasma-enhanced chemical vapour deposition with deposition parameters that generate strong competition between deposition and etching of the layer (cf. Dalakos, Plawsky and Persans, MRS Symp. Proc. Vol. 762, 2003 and G. Cicala, G. Bruno, P. Capezzuto, Pure & Appl. Chem., Vol. 68, No. 5, pp. 1143-1149, 1996). The advantage of such a one step process is that the so obtained intermediate layer has a bottom face which has naturally the morphology required by the present invention. In the present invention, the modification of Ry is not required, but only the angular morphology of the elementary surfaces as defined above.

According to a variant of the invention, the surface morphology of the bottom face 11 of the intermediate layer 5, as defined above, may be obtained by carrying out, after said intermediate layer 5 has been deposited, an additional step of evening the surface of said bottom face 11 of the intermediate layer 5 in order to obtain the required surface morphology of the bottom face 11. The step of depositing the intermediate layer 5 may use conventional deposition processes, such as evaporation, sputtering, dip coating and chemical vapour deposition. Preferably, PECVD (plasma-enhanced chemical vapour deposition) is used. The additional surface evening step uses one of the techniques chosen from the group comprising chemical-mechanical polishing (cf. J. Benedict et al., Proc. Mat. Res. Soc. Symp. 254, 1992), chemical etching (for example using HCl or $HNO_3$ for the ZnO intermediate layers or using HF for the silicon-based intermediate layers), plasma treatment (cf. WO 2007/113037) and sandblasting, the processes being known to those skilled in the art.

The "micromorph" cell according to the invention has an intermediate layer with faces having surface morphologies making it possible to optimally reconcile the morphologies required by each of the individual cells and thus to obtain a higher-performance device.

The present description is based on a device comprising two elementary cells. Of course, the device according to the invention may comprise more than two elementary cells, at least two cells of which are separated by an intermediate layer according to the invention.

The following examples illustrate the present invention without however limiting its scope.

EXAMPLES

Two tandem cells of the "micromorph" type with a p-i-n/p-i-n configuration are compared:
with a standard intermediate layer (Example 1); and
with an intermediate layer according to the invention (Example 2).
The other elements of the cells are identical.
The elementary cells are composed of a top cell 4 made of amorphous silicon and a bottom cell 6 made of microcrystalline silicon (cf. Fischer, Dubail, Selvan, Vaucher, Platz, Hof, Kroll, Meier, Torres, Keppner, Wyrsch, Goetz, Shah, and Ufert, in 25 IEEE PVSC, Washington D.C., 1996, p. 1053).

The substrate 2 used is glass (Schott AF 45) and the texture comprising highly inclined elementary surfaces is given by the first conducting ZnO layer 3 (front contact) which is deposited by LPCVD (low-pressure chemical vapour deposition) (cf. Fay, Steinhauser, Oliveira, Vallat-Sauvain and Ballif, "Opto-electronic properties of rough LP-CVD ZnO:B for use as TCO in thin-film silicon solar cells", Thin Solid Films, 515 (24), p. 8558-8561, 2007).

The top cell 4 has a thickness of 300 nm and the bottom cell 6 a thickness of 3000 nm.

The second conducting ZnO layer 7 (rear contact) is deposited by LPCVD (low-pressure chemical vapour deposition) on which a white dielectric that serves as rear reflector is applied (cf. Meier, Kroll, Spitznagel, Benagli, Roschek, Pfanner, Ellert, Androutsopoulos, Huegli, Buechel, Buechel, Nagel, Feitknecht and Bucher, <<Progress in up-scaling of thin film silicon solar cells by large-area PECVD KAI systems>>, Proc. of the 31th IEEE Photovoltaic Specialist Conference, Lake Buena Vista, Fla., USA, pp. 1464-1467, January, 2005).

The standard-type intermediate layer consists of a layer of $SiO_x$ 150 nm in thickness deposited by PECVD (cf. Buehlmann, Bailat, Domine, Billet, Meillaud, Feltrin and Ballif, APL 91, 143505, 2007).

The intermediate layer having the morphology according to the invention consists of an $SiO_x$ layer 150 nm in thickness deposited by PECVD and the bottom face 11 of which has undergone, after the deposition, a chemical-mechanical polishing operation so as to even its surface. This chemical-mechanical polishing (CMP) operation is carried out using a cloth (Article No. 40500232, DENKA D.200, a cloth of the Nap 5x type from Struers) and an abrasive based on colloidal silica particles (Article No. 40700001, OPSIF, an OP-S 5lt suspension from Struers). This process makes it possible to obtain an intermediate layer having the surface morphology of the bottom face suitable for growth of the bottom cell.

The surface of the interface between the layers measured by AFM can also be characterized with the standard technology like peak to valley roughness (Ry=Rmax). The surface roughness Ry of the top face 10 of the interface in the example 2 of invention is 1000 nm, and the surface roughness Ry of the bottom face 11 of the interface in the example 2 of the invention is 670 nm, which is greater than the value of 150 nm, known from US 2002/0011263 to deteriorate the electrical properties of the cell. The surface roughness Ry of the bottom face 11 is lower than the surface roughness Ry of the top face 10 in the example 2 of the invention, contrary to the teaching of U.S. Pat. No. 6,825,408.

Figure 3:
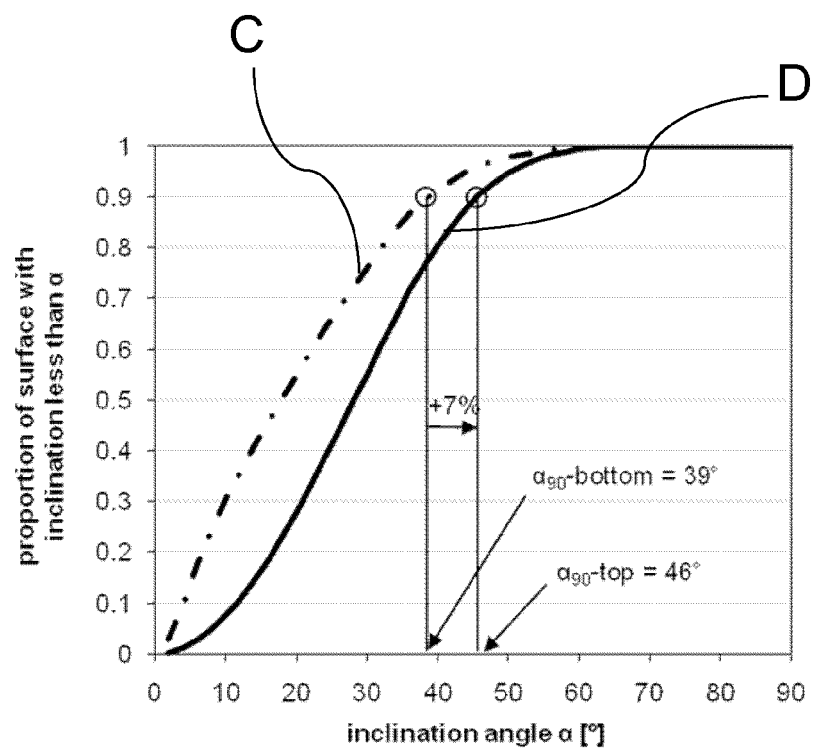
FIG. 3 shows the integral of the angular distribution of the top and bottom faces of the intermediate layer in a device according to the invention.

The surface morphologies of the top and bottom faces of an intermediate layer according to the invention are measured using the method described above. The integral of the angular distribution of the two faces of the intermediate layer in question, shown in FIG. 3, is obtained. In this figure, the angles are plotted on the x-axis. The proportion of the elementary surfaces having an inclination equal to or less than a given angle is plotted on the y-axis. Curve C corresponds to the bottom face of the intermediate layer and curve D corresponds to the top face. For each surface, an angle $\alpha_{90}$ is defined, which indicates that 90% of the elementary surfaces have an inclination equal to or less than this angle. In the present example, $\alpha_{90bottom}$ is equal to 39° and $\alpha_{90top}$ is equal to 46°, i.e. $\alpha_{90bottom}$ is smaller than $\alpha_{90top}$ by 7°.

By way of comparison, the top and bottom faces of the standard intermediate layer have the same $\alpha_{90}$, in such a way that the difference ($\alpha_{90top} - \alpha_{90bottom}$) is of 0°.

The open-circuit voltage ($V_{oc}$) and the fill factor (FF) are extracted from the characteristic current-voltage (I-V) curve under illumination with an AM1.5G solar spectrum. The short-circuit current density ($J_{sc}$) is calculated from the measurement of the external quantum efficiency (EQE) by integrating, over the spectrum from 350 to 1100 nm, the product of the EQE multiplied by the incident photon flux for the solar spectrum defined by AM1.5G. The conversion efficiency (n) is calculated by multiplying $V_{oc}$, FF and J.

The results obtained are indicated in the following table:

| Device | Intermediate layer | $J_{sc\_top}/J_{sc\_bottom}$ (mA/cm$^2$) | $V_{oc}$ (V) | FF | η (%) |
| --- | --- | --- | --- | --- | --- |
| Example 1 (comparative) | 150 nm SiO$_x$ | 13.36/12.35 | 1.351 | 0.672 | 11.2 |
| Example 2 (Invention) | 150 nm SiO$_x$ + polishing | 13.14/12.22 | 1.351 | 0.734 | 12.1 |

The results show, on the one hand, that the "micromorph" cell according to the invention is functional. On the other hand, the benefit obtained using an intermediate layer having the surface morphology according to the invention consists of an increase in the fill factor (FF), while maintaining the optical characteristics ($J_{sc}$), manifested by an increase in the conversion efficiency η from 11.2% to 12.1%, i.e. an 8% improvement.

The invention claimed is:

1. A multiple-junction photoelectric device comprising a substrate on which a first conducting layer is deposited, at least two elementary photoelectric devices of p-i-n or p-n configuration, on which a second conducting layer is deposited, and at least one intermediate layer provided between two adjacent elementary photoelectric devices, wherein said intermediate layer has, on the incoming light side, a top face and, on the other side, a bottom face, said top and bottom faces having respectively a surface morphology comprising inclined elementary surfaces such that $\alpha_{90bottom}$ is smaller than $\alpha_{90top}$ by at least 3°, where $\alpha_{90top}$ is the angle for which 90% of the elementary surfaces of the top face of the intermediate layer have an inclination equal to or less than this angle, and $\alpha_{90bottom}$ is the angle for which 90% of the elementary surfaces of the bottom face of the intermediate layer have an inclination equal to or less than this angle.

2. The device according to claim 1, wherein $\alpha_{90bottom}$ is smaller than $\alpha_{90top}$ by at least 6°.

3. The device according to claim 2, wherein $\alpha_{90bottom}$ is smaller than $\alpha_{90top}$ by at least 10°.

4. The device according to claim 3, wherein $\alpha_{90bottom}$ is smaller than $\alpha_{90top}$ by at least 15°.

5. The device according to claim 1, wherein $\alpha_{90top}$ is comprised between 20° and 80°.

6. The device according to claim 5, wherein $\alpha_{90top}$ is comprised between 40° and 80°.

7. The device according to claim 1, wherein $\alpha_{90bottom}$ is comprised between 0° and 40°.

8. The device according to claim 7, wherein $\alpha_{90bottom}$ is comprised between 5° and 40°.

9. The device according to claim 1, wherein the elementary photoelectric device, located on the side towards the substrate with respect to the intermediate layer, is based on amorphous silicon and in that the other elementary photoelectric device is based on microcrystalline silicon.

10. The device according to claim 1, wherein the intermediate layer has a thickness of between 10 nm and 500 nm.

11. The device according to claim 10, wherein the intermediate layer has a thickness of between 50 nm and 150 nm.

12. The device according to claim 1, wherein the intermediate layer consists of a layer of a material chosen from the group consisting of zinc oxide, doped silicon oxides, doped porous silicon oxides, tin oxide, indium oxide, doped silicon carbide, doped amorphous silicon, doped microcrystalline silicon and combinations thereof.

13. The device according to claim 1, wherein the surface morphology of the bottom face of the intermediate layer is obtained using a one step process for depositing the intermediate layer that makes it possible to obtain, during its deposition, a planarized surface corresponding to the required surface morphology of the bottom face.

14. The device according to claim 1, wherein the surface morphology of the bottom face of the intermediate layer is obtained by carrying out, after said intermediate layer has been deposited, an evening of the surface of said bottom face in order to obtain the required surface morphology of the bottom face.

* * * * *

UNITED STATES PATENT AND TRADEMARK OFFICE
CERTIFICATE OF CORRECTION

PATENT NO. : 8,368,122 B2
APPLICATION NO. : 13/130205
DATED : February 5, 2013
INVENTOR(S) : Domine et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 6 days.

Signed and Sealed this
First Day of September, 2015

Michelle K. Lee
*Director of the United States Patent and Trademark Office*